United States Patent [19]

Mochizuki et al.

[11] 4,219,373
[45] Aug. 26, 1980

[54] METHOD OF FABRICATING A SEMICONDUCTOR DEVICE

[75] Inventors: Yasuhiro Mochizuki; Hiroaki Hachino, both of Hitachi; Yutaka Misawa, Katsuta; Yoko Wakui, Hitachi, all of Japan

[73] Assignee: Hitachi, Ltd., Japan

[21] Appl. No.: 1,163

[22] Filed: Jan. 5, 1979

[30] Foreign Application Priority Data

Jan. 11, 1978 [JP] Japan .................................... 53-1125

[51] Int. Cl.² .......................................... H01L 21/225
[52] U.S. Cl. ................................................. 148/187; 29/588
[58] Field of Search ...................... 148/187, 188, 33.5; 29/588; 156/660

[56] References Cited

U.S. PATENT DOCUMENTS

| | | | |
|---|---|---|---|
| 3,269,861 | 8/1966 | Schneble et al. | 156/660 X |
| 3,735,483 | 5/1973 | Sheldon | 29/580 |
| 3,936,319 | 2/1976 | Anthony et al. | 148/187 X |
| 3,998,662 | 12/1976 | Anthony et al. | 148/1.5 |
| 4,040,878 | 8/1977 | Rowe | 148/188 |
| 4,066,485 | 1/1978 | Rosnowski et al. | 148/188 |

Primary Examiner—G. Ozaki
Attorney, Agent, or Firm—Craig & Antonelli

[57] ABSTRACT

A method of fabricating a semiconductor device of the type wherein aluminium layers are selectively deposited on the major surface of a silicon semiconductor substrate and thereafter aluminium is selectively diffused into the silicon semiconductor substrate by means of heat treatment in an atmosphere including an oxygen gas. Recesses are selectively formed in at least one major surface of the silicon semiconductor substrate, aluminium is deposited onto the recesses, and the silicon semiconductor substrate is then subjected to a heat treatment to selectively diffuse the aluminium into the silicon semiconductor substrate. Layers of oxide of silicon-aluminium alloy formed on the major surface subjected to the aluminium diffusion will not cause any damage of a photo-mask and at the same time accuracy in positioning the photo-mask may be improved. A failure to mount a semiconductor element onto a heat sink may also be prevented.

11 Claims, 7 Drawing Figures

METHOD OF FABRICATING A SEMICONDUCTOR DEVICE

This invention relates to a method of fabricating a semiconductor device and more particularly to a method of selective formation of aluminium-diffused layers within a silicon semiconductor substrate.

Aluminium is a P-type dopant having a high diffusion speed in silicon and is therefore highly effective for forming a deeply-diffused layer such as for example a through-diffused layer for the isolation purposes. A method has hitherto been known in which aluminium diffusion source layers in the form of a predetermined pattern are formed on the major surface of a silicon semiconductor substrate by means of deposition or the like, and the silicon semiconductor substrate is then heated in an atmosphere including an oxygen gas to form silicon-aluminium alloy layers from which aluminium diffuses into the silicon semiconductor substrate to deeply and selectively form aluminium diffused layers.

The conventional method as described above, however, encounters a problem that the pattern of the diffused layers being formed becomes irregular depending on the conditions of the initial phase of the heat treatment required for alloying silicon and aluminium and of the aluminium diffusion. More particularly, depending on such conditions as differences in area occupied by the alloy created during the diffusion process and in wet state and degree of dripped edge of the aluminium diffusion source layer, depth and concentration of the diffusion and precision of the pattern become irregular and their reproducibility becomes lowered.

Moreover, on the major surface of the silicon semiconductor substrate which has undergone the diffusion process are formed layers of oxide of silicon-aluminium alloy which are highly resistive against removal by chemical dissolution. In the subsequent process, these residua will cause a damage of a photo-mask and a failure to mount the semiconductor element onto the heat sink, and thus impair accuracy in positioning the photo-mask.

Accordingly, it is a prime object of this invention to provide a method of fabricating a semiconductor device based on selective diffusion of aluminium which may obviate all of the aforementioned disadvantages.

The method of fabricating a semiconductor device according to the invention comprises the steps of forming recesses in the form of a predetermined pattern in at least one major surface of a silicon semiconductor substrate, depositing aluminium onto the recesses, and thereafter heating the silicon semiconductor substrate in an atmosphere including an oxygen gas to selectively diffuse the aluminium thereinto.

The above and other objects can be attained by the present invention as will be apparent from the following description taken in conjunction with the accompanying drawings and the appended claims.

The invention will now be described in more detail by way of an example of isolation diffusion required for fabrication of a planar type thyristor.

Figure 1A:
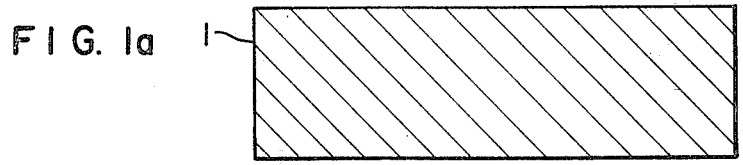
FIGS. 1a to 1f are longitudinal sectional views of a semiconductor substrate to explain the steps of the fabrication method embodying the invention.

In FIG. 1a, there is shown a silicon semiconductor substrate 1. The silicon semiconductor substrate 1 is prepared through FZ (Floating Zone) method with its surfaces polished to mirror fineness, and has an N-conductivity type, a resistivity of 90 to 120 $\Omega$-cm, a dislocation-free property, a crystal axis of $<111>$, a diameter of 50 mm, and a thickness of 450 $\mu$m.

Figure 1B:
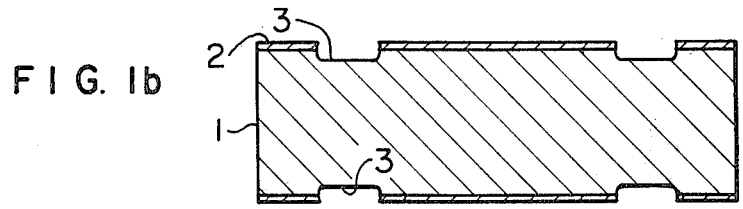

As shown in FIG. 1b, on the opposite major surfaces of the silicon semiconductor substrate 1 are formed photoresist layers 2 in the form of a predetermined pattern for the purpose of leaving behind recesses 3 in the opposite major surfaces of the silicon semiconductor substrate 1. The photoresist layer 2 has a thickness of 3 $\mu$m and a mixed solution of hydrofluoric acid, nitric acid and acetic acid is used for etching off the recesses 3 by a depth of 6±1 $\mu$m. The recesses 3 are arranged to be patterned into an orthogonal grating, having each a width of 116 $\mu$m and being mutually spaced by a distance of 1.76 mm.

Figure 1C:
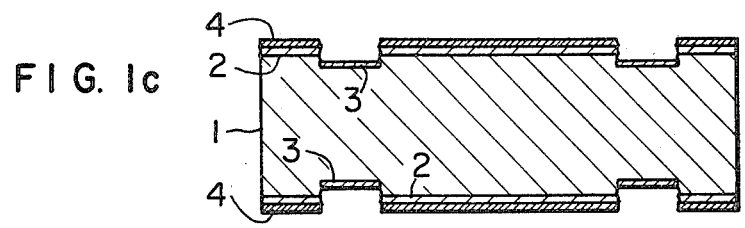

The silicon semiconductor substrate is then coated with aluminium deposited layers 4 as shown in FIG. 1c. Aluminium is deposited in vacuum from a diffusion source of an aluminium wire having a purity of 99.9995% onto the substrate maintained at a temperature of 120° to 140° C. under a pressure of $3 \times 10^{-6}$ Torr by electron-beam heating to form the aluminium deposited layer having a thickness of 5 $\mu$m.

Figure 1D:
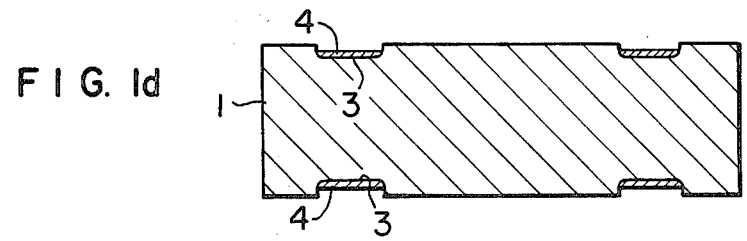

The aluminium deposited layers 4 formed on the photoresist layers 2 are removed from the silicon semiconductor substrate 1 by dissolving the photoresist layers 2 with exfoliation liquid as shown in FIG. 1d. Thus, the aluminium deposited layers 4 are patterned to remain in the recesses 3 formed in the major surfaces of the silicon semiconductor substrate 1.

Alternatively, the aluminium deposited layers 4 can be patterned to remain in the recesses 3 formed in the major surfaces of the silicon semiconductor substrate 1 by depositing the aluminium over the entire area of the major surfaces (that is, the recessed and non-recessed portion), applying the photoresist only on the deposited aluminium in the recessed portions, and then removing the aluminium deposited on the non-recessed portions of the major surfaces.

Figure 1E:
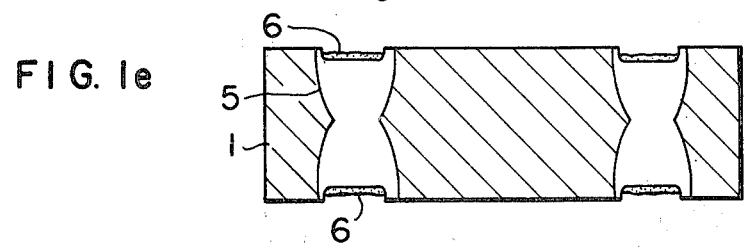

Thereafter, the silicon semiconductor substrate 1 is heated for causing the aluminium to be selectively diffused into the substrate as shown in FIG. 1e. In the diffusion process, both the initial heat treatment for alloying and the diffusing atmosphere play important roles. Namely, the silicon semiconductor substrate 1 is gradually heated at a temperature elevation rate of not more than 10° C./min. after its temperature reaches a temperature slightly below an eutectic point (577° C.) of the aluminium-silicon alloy, thereby to ensure good wettability of aluminium to the recesses of the silicon semiconductor substrate 1, so that uniform aluminium-silicon alloy layers may be formed, whereby reproducibility and precision of the diffused pattern and profile may be improved. It is also advantageous to place the substrate in a diffusing atmosphere containing a mixed gas flow containing oxygen of 0.05 to 10% by volume and nitrogen of not less than 90% by volume. P-type through-diffused layers (isolation diffused layers) 5 are formed by diffusing at 1250° C. for 72 hours.

Concurrently with the formation of the isolation diffused layers, oxide films of aluminium-silicon alloy are created as diffusion source residua 6 on the portions of the surfaces of the selective aluminium diffused layers 5. The oxide film is identified by X-ray diffraction as a substance mainly containing α-alumina (Al₂O₃) which is very hard and difficult to dissolve chemically.

In the case where aluminium is deposited onto the major surface of the conventional silicon semiconductor substrate and diffused thereinto, the diffusion source residua turn into irregular projections present on the major surface of the silicon semiconductor substrate and in the subsequent processes, these projections tend to damage the photo-mask and cause a failure to mount and bond the semiconductor element to the heat sink.

According to the invention, since aluminium is selectively diffused from the diffusion source received in the recess formed in the major surface of the silicon semiconductor substrate, the diffusion source residua are confined within the recess without creating projections which would extend above the major surface of the silicon semiconductor substrate, thus eliminating the conventional disadvantages.

The diffused pattern (the width of the diffused layer in the substrate surface) can be formed with an accuracy of within ±2% which is improved over an accuracy of ±7% of the conventional method.

Furthermore, with the conventional method, the aluminium deposited layer 4 having a thickness of more than 3 μm will drip at its edge in the course of diffusion and the diffused pattern will deform. Therefore, it is necessary to limit the thickness of the aluminium deposited layer to about 1 μm for practical purposes.

According to the fabrication method of the present invention, the aluminium deposited layer is filled within the recess 3 formed in the silicon semiconductor substrate surface and will not drip so that a deep diffused layer can easily be created at a high concentration.

Figure 2:
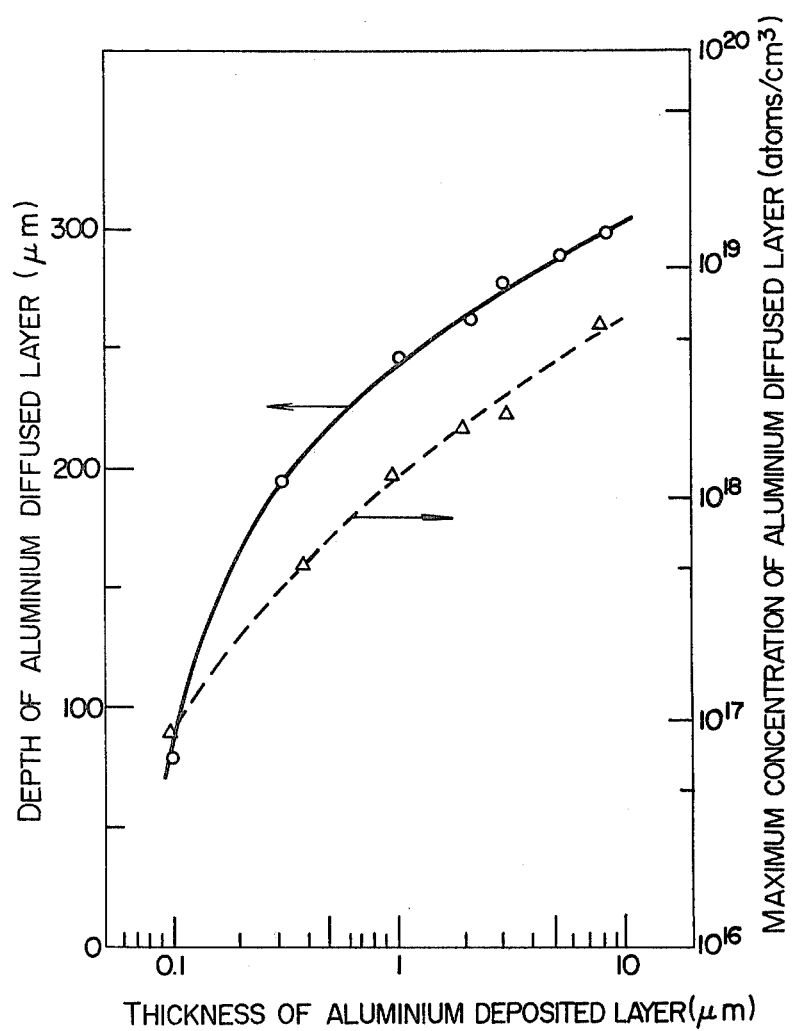
FIG. 2 is a graphical representation showing dependency of depth and maximum diffusion concentration of the aluminium diffusion upon the thickness of an aluminium deposited layer.

FIG. 2 shows dependency of depth (solid curve in FIG. 2) and maximum diffusion concentration (broken curve in FIG. 2) of the aluminium diffusion, respectively on the thickness of the aluminium deposited layer. Data indicated in the figure is specifically related to a 96-hour diffusion at 1250° C. but teaches a general tendency that a highly concentrated, deep diffused layer can easily be obtained with a thick aluminium deposited layer. Time required for forming a diffused layer of a desired depth can be decreased 20 to 30% as compared with the conventional method.

Figure 1F:
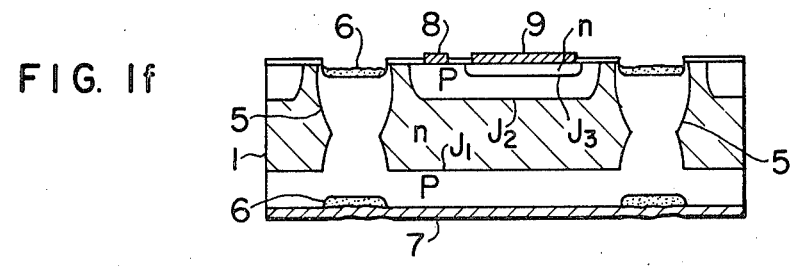

FIG. 1f shows, in section, a planar type thyristor which is prepared through a process wherein dopants of P-type and N-type are first diffused into the silicon semiconductor substrate 1 as shown in FIG. 1e by applying the usual semiconductor device fabricating technique to form p-n junctions J₁ to J₃, anode, gate and cathode electrodes 7, 8 and 9 are then formed, and finally the substrate is subjected to dicing at the central portion of the isolation diffused layer 5 to leave separated pellets. Respective pellets are mounted onto a heat sink and provided with electrodes. A resulting assembly is molded with insulating resin to complete a planar type thyristor.

While, in the foregoing embodiment, lift-off method utilizing photoresist was used to form the aluminium deposited layer in the form of the predetermined pattern, the aluminium deposited layer may be patterned by photo-etching. In place of the diffusion source of aluminium deposited layer, a diffusion source of aluminium-silicon alloy may be used.

As described above, the invention ensures that aluminium is selectively diffused rapidly at a high concentration and with high accuracy, and is meritorious in industrial applications. The invention was described by way of the embodiment as applied to the isolation diffusion but it is obviously applicable to formation of other types of diffused layer.

What is claimed is:

1. A method of fabricating a semiconductor device of the type wherein aluminium is selectively diffused into a silicon semiconductor substrate comprising the steps of:
   (a) selectively forming recesses in at least one major surface of said silicon semiconductor substrate;
   (b) depositing aluminium into said recesses;
   (c) diffusing the aluminium into said silicon semiconductor substrate by subjecting it to a heat treatment, the diffusion being effected in an atmosphere containing an oxidizing gas, whereby diffusion source residua formed by oxidation of the aluminium is confined in said recesses and prevented from creating projections extending above said at least one major surface of the substrate.

2. A method of fabricating a semiconductor device according to claim 1, wherein said step of depositing the aluminium into said recesses comprises applying a photoresist on portions of said at least one major surface other than said recesses, depositing the aluminium onto an entire area of said at least one major surface, and removing the aluminium deposited on the portions other than said recesses together with the photoresist by lifting-off method.

3. A method of fabricating a semiconductor device according to claim 2, wherein said step of selectively forming recesses comprises applying a photoresist layer in the form of a predetermined pattern, and then etching the exposed portion of the silicon substrate to form the recesses.

4. A method of fabricating a semiconductor device according to claim 3, wherein said photoresist layer is left on the silicon substrate after etching the silicon substrate and constitutes the photoresist applied to the portions of the at least one major surface other than the recesses.

5. A method of fabricating a semiconductor device according to claim 1, wherein said step of depositing the aluminium into said recesses comprises depositing aluminium on the entire area of said at least one major surface, applying the photoresist only on the deposited aluminium within said recesses, and removing the aluminium deposited on portions of said at least one major surface other than said recesses.

6. A method of fabricating a semiconductor device according to claim 1, wherein said aluminium selective diffusion is effected in an atmosphere of a mixed gas of nitrogen and oxygen.

7. A method of fabricating a semiconductor device according to claim 6, wherein said mixed gas contains oxygen 0.05 to 10% by volume.

8. A method of fabricating a semiconductor device according to claim 1, wherein said aluminium selective diffusion is adapted to form isolation regions.

9. A method of fabricating a semiconductor device according to claim 1, wherein isolation regions in the form of a grating are formed on said major surface, a single semiconductor element is formed within each portion surrounded by said isolation regions, semiconductor elements associated with respective portions are pelletized to be separated into individual ones, and thereafter the individual semiconductor element is mounted on a heat sink and molded with insulating resin.

10. A method of fabricating a semiconductor device according to claim 1, wherein the aluminium deposited into the recesses does not project above the at least one major surface in which the recesses are formed.

11. A method of fabricating a semiconductor device of the type wherein aluminium is selectively diffused into a silicon substrate comprising the steps of:

(a) selectively forming recesses in at least one major surface of said silicon semiconductor substrate;

(b) depositing an aluminium silicon alloy into said recesses as a diffusion source of said aluminium;

(c) diffusing the aluminium into said silicon semiconductor substrate by subjecting it to a heat treatment, the diffusion being effected in an atmosphere containing an oxidizing gas, whereby diffusion source residua formed by oxidation of the aluminium is confined in said recesses and prevented from creating projections extending above said at least one major surface of the substrate.

* * * * *